United States Patent
DeVries et al.

(10) Patent No.: US 8,035,382 B2
(45) Date of Patent: Oct. 11, 2011

(54) COIL DECOUPLING IN MAGNETIC RESONANCE IMAGING

(75) Inventors: Jon T. DeVries, Jersey City, NJ (US); Erzhen Gao, Millburn, NJ (US); Ingmar Viohl, Milwaukee, WI (US); Greig Scott, Palo Alto, CA (US); Kamal Vij, Chandler, AZ (US); Joseph R. Flicek, New York, NY (US)

(73) Assignee: m2m Imaging Corporation, Cleveland, OH (US)

( * ) Notice: Subject to any disclaimer, the term of this patent is extended or adjusted under 35 U.S.C. 154(b) by 579 days.

(21) Appl. No.: 11/720,049

(22) PCT Filed: Nov. 22, 2005

(86) PCT No.: PCT/US2005/042464
§ 371 (c)(1),
(2), (4) Date: Jan. 9, 2009

(87) PCT Pub. No.: WO2006/137946
PCT Pub. Date: Dec. 28, 2006

(65) Prior Publication Data
US 2009/0230965 A1    Sep. 17, 2009

Related U.S. Application Data

(60) Provisional application No. 60/630,457, filed on Nov. 23, 2004, provisional application No. 60/630,223, filed on Nov. 23, 2004, provisional application No. 60/630,220, filed on Nov. 23, 2004.

(51) Int. Cl.
*G01V 3/00* (2006.01)

(52) U.S. Cl. .................................. 324/318; 324/322
(58) Field of Classification Search ........... 324/300–322
See application file for complete search history.

(56) References Cited

U.S. PATENT DOCUMENTS

| | | | | |
|---|---|---|---|---|
| 6,344,745 | B1 * | 2/2002 | Reisker et al. | 324/318 |
| 6,831,460 | B2 * | 12/2004 | Reisker et al. | 324/318 |
| 7,190,165 | B2 * | 3/2007 | Hammond et al. | 324/318 |
| 2004/0124840 | A1 * | 7/2004 | Reykowski | 324/318 |

FOREIGN PATENT DOCUMENTS

| | | |
|---|---|---|
| DE | 19505062 A1 | 10/1996 |
| JP | 04180733 | 6/1992 |
| JP | 08229019 | 9/1996 |

(Continued)

OTHER PUBLICATIONS

Wright, et al., In Vivo MR Micro Imaging With Conventional Radiofrequency Coils Cooled to 77° K, Magnetic Resonance in Medicine, 2000, pp. 163-169, vol. 43.

(Continued)

*Primary Examiner* — Dixomara Vargas
(74) *Attorney, Agent, or Firm* — Driggs, Hogg, Daugherty & Del Zoppo Co., LPA (57) ABSTRACT

A radio frequency coil array ($50$) includes at least first ($50_1$) and second ($50_2$) receive coils. A flux pipe ($52$) includes electrically connected first ($252_1$) and second ($252_2$) loop coils. The first ($252_1$) and second ($252_2$) loop coils are coupled to the respective first and second receive coils. The flux pipe ($52$) reduces mutual inductance between the first ($50_1$) and second ($50_2$) receive coils.

28 Claims, 8 Drawing Sheets

FOREIGN PATENT DOCUMENTS

JP 2000225104 A 8/2000

OTHER PUBLICATIONS

Wosik, et al., Magnetic Resonance Imaging (MRI) in Human Organs Using HTS Surface Coils, Institute for Space Systems Operations 2001 Annual Report, 2001, pp. 106-109, downloaded http://www.isso.uh.edu/publications/a2001/209-wosik.htm.

Ma, et al., Superconducting RF Coils for Clinical MR Imaging at Low Field, Academic Radiology, Sep. 2003, pp. 978-987, vol. 10, No. 9.

Boskamp, et al., On the coil noise contribution to SNR versus coil diameter, temperature, frequency and load distance, Poc. Intl., Soc. Mag. Reson. Med., 2005, p. 916, vol. 13.

International Search Report re:PCT/US2005/042464, 3 sheets.

* cited by examiner

COIL DECOUPLING IN MAGNETIC RESONANCE IMAGING

The present application claims priority to U.S. Provisional Patent Application Ser. No. 60/630,223, entitled System and Method for Expanding Bandwidth of a Magnetic Resonance Imaging System U.S. Provisional Patent Application Ser. No. 60/630,220, entitled Apparatus and Method for Cryogenically Cooling a Coil on a Magnetic Resonance Imaging System, and U.S. Provisional Patent Application Ser. No. 60/630, 547, entitled System and Method for Decoupling Coils in a Magnetic Resonance Imaging System, all of which were filed on Nov. 23, 2004.

BACKGROUND

The present application relates to the decoupling of radio frequency coils. It finds particular application to the decoupling of receive coils used in magnetic resonance (MR) applications.

MR imaging has proven to be a valuable technique for providing information about the internal structure and function of an object under examination. In medical imaging, for example, MR imaging techniques are widely used to provide information on the physiology of human patients.

One limitation, however, on the utility of images and other information generated by MR scanners is the effect of electronic noise. Indeed, signal to noise ratio (SNR) is a key parameter used to evaluate the quality of the information generated by an MR system.

Various techniques have been used to improve MR system SNR. As increasing the strength of the main magnetic field increases the strength of the resultant MR signals, there has been an ongoing trend toward the use of scanners having ever higher field strengths. However, systems incorporating higher field strength magnets are generally more complex, larger, and more expensive than lower field strength systems. Physiological and other limitations, such as Specific Absorption Ratio (SAR) limits, also complicate the move to higher field strengths. Moreover, even for a system operating at a given field strength, it remains desirable to provide a relatively higher SNR.

Another technique for compensating for SNR performance and improving image quality has been the use of relatively longer scanning times. However, increasing the scanning time can lead to increased motion artifacts, have a deleterious impact on patient comfort, and results in the less efficient utilization of the scanner. Again, for a given imaging time, it also remains desirable to provide a relatively higher SNR.

Yet another technique has been the use of anatomy specific radio frequency (RF) coils which provide an improved SNR than the large body receive coil built into the MR scanner. One technique has seen the adoption of surface and other coils having a relatively small field of view (FOV). While reducing coil FOV tends to reduce the effects of sample generated noise (e.g., body or tissue noise in a human patient), the smaller FOV can be problematic when imaging relatively larger areas such as the brain, spine, or heart.

As a result, coils having multiple smaller coils have been developed. A particular advantage of such array coils is their ability to provide a relatively larger FOV while still providing higher sensitivity and lower noise performance. Unfortunately, however, inductive coupling between the individual coils in the array can have a deleterious effect on the performance of the overall coil array and the resultant image quality.

Various techniques have been used to address this receive-receive coupling issue. In one technique, the various coils in the array of coils are partially overlapped. While such a technique can be effective for reducing the mutual inductance between the coils, physical constraints can make it difficult to implement, especially when the array contains many small coils. However, to maintain the FOV, this approach requires that each element be slightly larger, typically in the range of 25% to 40%, so that the coils can be overlapped. Increasing the size of the individual loops effectively reduces the SNR benefit of using arrays of smaller coils. It can also be difficult to implement when the coils are implemented on a planar or otherwise non-conformable substrate, as may occur when, for example, the coils are fabricated from high temperature superconductors (HTS) or other superconducting materials which typically use a substrate such as sapphire or lanthanum aluminate.

In another technique associated with parallel imaging such as SENSE or SMASH, the array coils are designed such that there are gaps between the individual elements. In this design, decoupling the coils via overlapping is not possible and a capacitive or inductive technique is used to decouple the coils. However, the capacitors and inductors introduce impedance into the circuit. This impedance degrades noise performance, and can be especially significant as the number of coils and decoupling circuits in the array is increased.

Capacitive and low input impedance pre-amplifier decoupling techniques have also been implemented. Unfortunately, however, these techniques can degrade the SNR of the coil, especially where the coil includes a relatively large number of coil elements or where body noise is relatively small. Moreover, these techniques are relatively difficult to implement in an HTS coil array without degrading the quality factor of the HTS coil.

SUMMARY

Aspects of the present invention address these matters, and others.

According to a first aspect of the present invention, an apparatus for use in magnetic resonance imaging includes a first magnetic resonance receive coil, a second magnetic resonance receive coil, a first decoupling coil inductively coupled to the first receive coil, and a second decoupling coil electrically connected to the first decoupling coil and inductively coupled to the second receive coil such that the first and second decoupling coils cooperate to reduce an inductive coupling between the first and second receive coils.

According to another aspect of the present invention, a method includes the steps of using a first receive coil to receive magnetic resonance signals produced by MR active nuclei in an object under examination, using a second receive coil to receive magnetic resonance signals produced by MR active nuclei in the object, inducing a current in a first decoupling coil in response to a current in the first receive coil, using a second decoupling coil which is electrically connected to the first decoupling coil to induce a second current in the second receive coil. A current in the first receive coil induces a first current in the second receive coil; and the first and second currents are 180° out of phase.

According to another aspect of the invention, a magnetic resonance coil array includes a plurality of receive coils and at least one flux pipe. The flux pipe includes a first decoupling coil inductively coupled to a first receive coil. The flux pipe also includes a second decoupling coil electrically connected to the first decoupling coil and inductively coupled to a second receive coil. The flux pipe reduces an inductive coupling between the first and second receive coils.

According to another aspect of the invention a magnetic resonance imaging apparatus includes a magnet which generates a main magnetic field in an examination region, gradient coils which generate time varying gradient magnetic fields in the examination region, a radio frequency transmit coil which excites magnetic resonance in MR active nuclei located in the examination region, at least first and second receive coils which receive magnetic resonance signals emitted by the MR active nuclei, and flux pipe means including a first coil loop inductively coupled to the first receive coil and a second coil loop inductively coupled to the second receive coil for reducing mutual inductance between the first and second receive coils.

Those skilled in the art will appreciate still other aspects of the present invention upon reading and understanding the attached figures and description.

FIGURES

The present invention is illustrated by way of example and not limitation in the figures of the accompanying drawings, in which like references indicate similar elements and in which:

FIG. 2b depicts the equivalent electrical circuit of the coil of FIG. 2a.

DESCRIPTION

Figure 1:
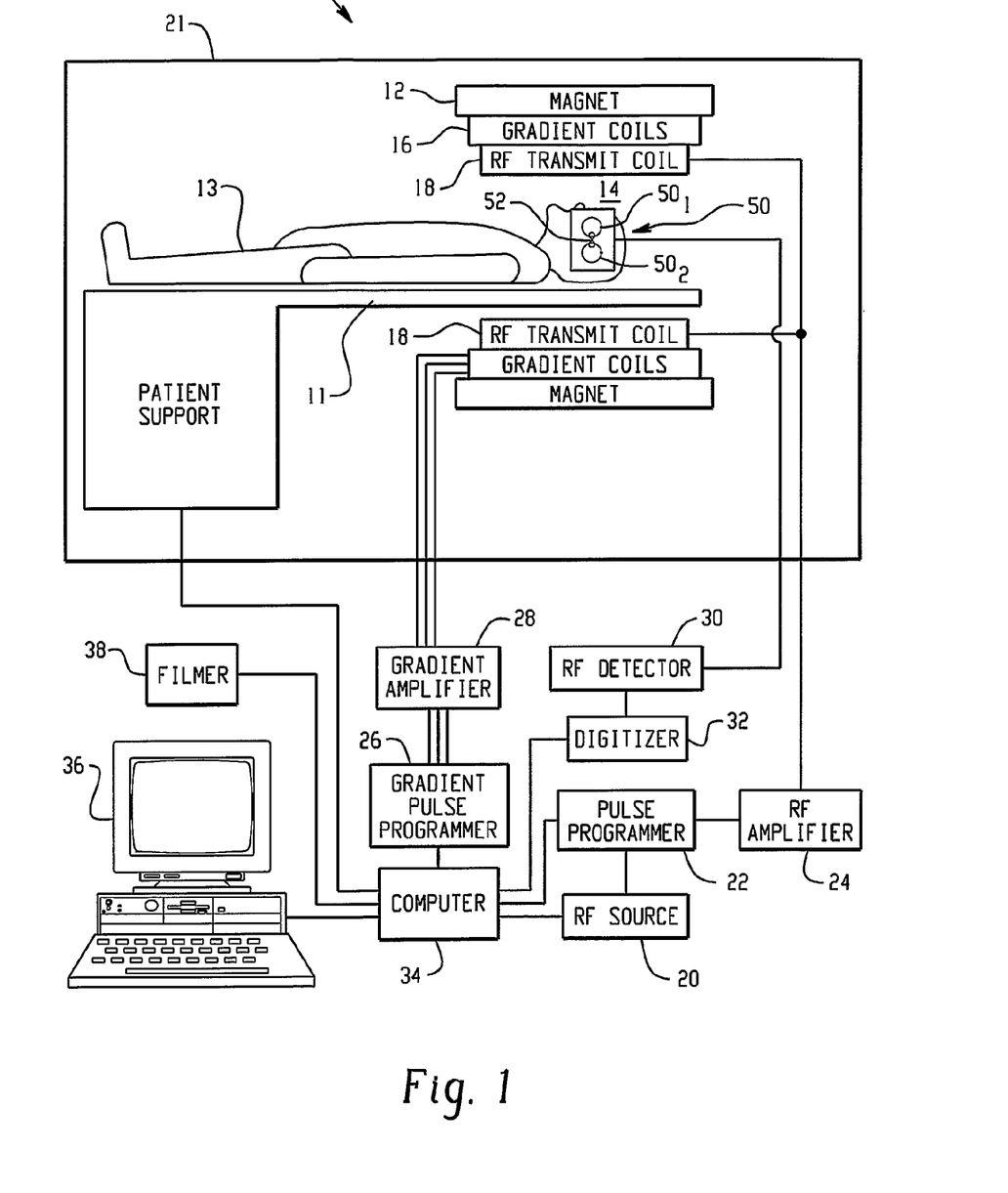
FIG. 1 depicts a functional block diagram of a magnetic resonance scanner and coil array.

With reference to FIG. 1, an exemplary MR scanner 10 includes a main magnet 12 which produces a substantially homogeneous, temporally constant main magnetic field $B_0$ in an examination region 14. Depending on the desired main magnetic field strength and the requirements of a particular application, various magnet technologies (e.g., superconducting, resistive, or permanent magnet technologies) and physical magnet configurations (e.g., solenoidal or open magnet configurations) have been implemented.

A patient support 11 supports a human patient or other object being examined 13 in the examination region 14. Gradient coils 16 generate time varying gradient magnetic fields along the x, y, and z-axes of the examination region 14. An RF transmit coil 18 produces radio frequency signals which excite or otherwise manipulate hydrogen or other magnetic resonant active nuclei in the object 13. To improve the homogeneity of the excitation, a relatively large or whole body transmit coils is typically implemented.

As will be explained in more detail below, a multi-element RF receive coil 50 located near a region of interest of the object 13 receives magnetic resonance signals generated by the excited nuclei. The receive coil 50 includes at least first $50_1$ and $50_2$ coils disposed in relation to each other. A flux pipe 52 reduces receive-receive coupling between the two coils.

While the transmit 18 and receive 50 coils are depicted as separate coils, a combined transmit receive coil may also be implemented, as may local transmit coils.

The magnet 12, patient support 11, gradient coils 16, and RF coils 18, 20 are typically located in a magnetically and radio frequency shielded enclosure 21.

An RF source 20 generates an RF signal having a desired frequency (e.g., the Larmor frequency of the MR active nuclei under investigation), a pulse programmer 22 shapes the RF signals, and an RF amplifier 24 amplifies the shaped signals to the levels required by the transmit coil 18 for exciting nuclei in the object 13. A gradient pulse programmer 26 establishes the shape and amplitude of the desired time varying magnetic fields, and a gradient amplifier 28 amplifies these signals to the levels required by the respective x, y, and z gradient coils 16. An RF detector 30 receives and amplifies the signals generated by the receive coil 20. The signals are, in turn, converted to digital form by a digitizer 32.

One or more computers 34 associated with the scanner 10 coordinate the operation of the gradient and RF systems, for example to generate desired pulse sequences. The signals generated by the digitizer 32 are further processed to generate volumetric data indicative of the object 13. An operator console 36 includes human perceptible input and output devices such as a keyboard, mouse, and display or monitor. The console 36 allows the operator to interact with the scanner, for example by selecting desired pulse sequences and other desired examination protocols, initiating and terminating scans, and viewing and otherwise manipulating the volumetric data. A filmer or other hard copy device 38 may be used to provide images of the volumetric data.

Figure 2A:
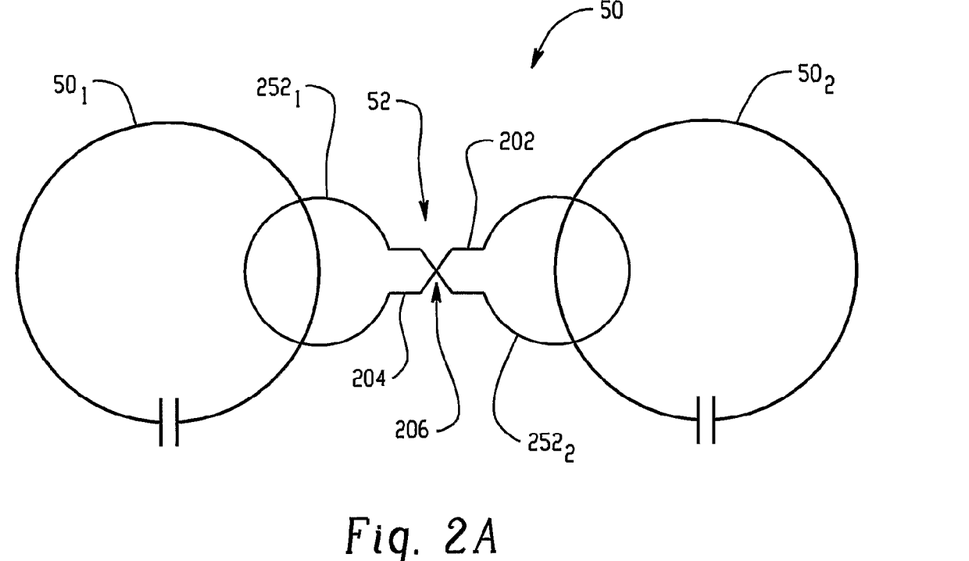
FIG. 2a depicts a two element RF coil.
Figure 2B:
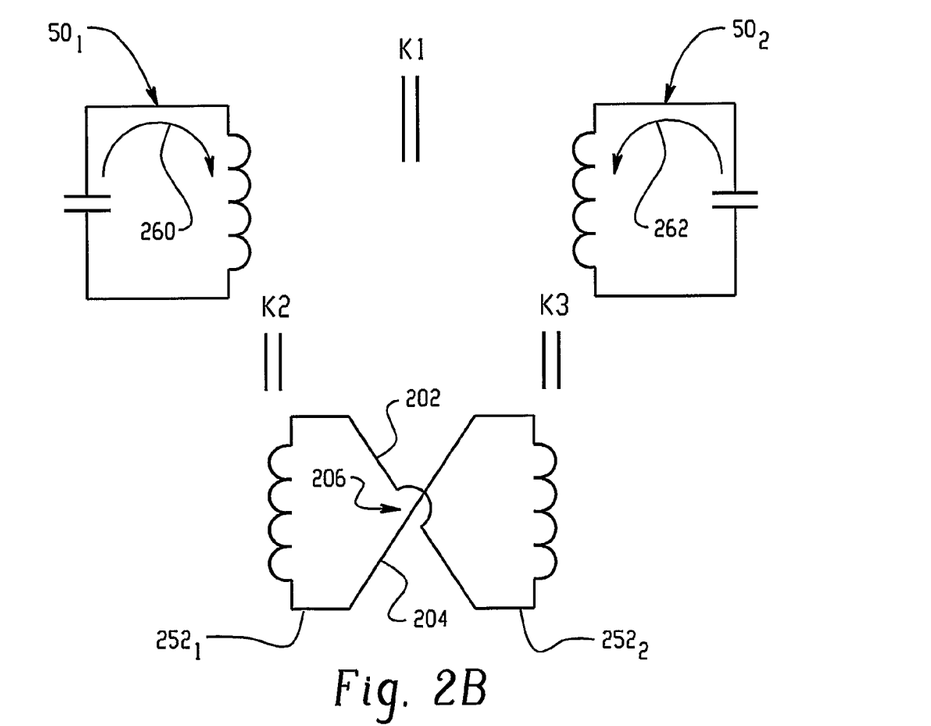
Figure 2C:
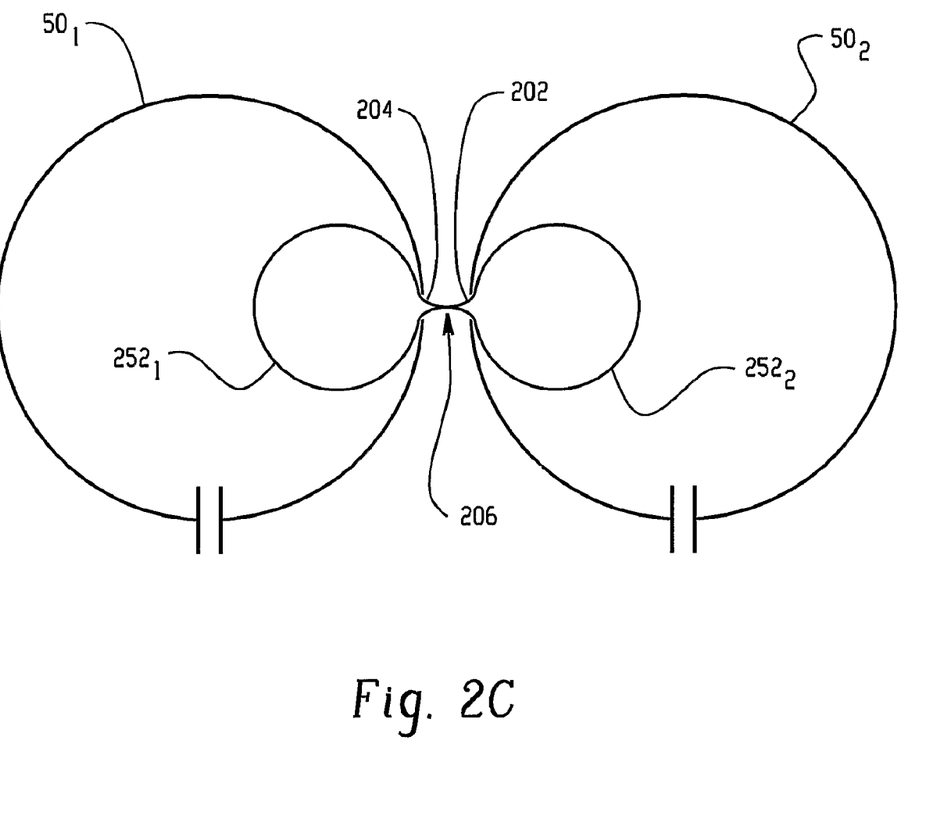
FIG. 2c depicts a two element RF coil.

Turning now to FIG. 2, a two element receive coil includes first $50_1$ and second $50_2$ coil elements and a flux pipe 52. Each coil $50_1$, $50_2$ detects magnetic resonance signals generated by the MR active nuclei in the object 13 near the respective coil, and is tuned so as to be resonant at or near the Larmor frequency of the nuclei being investigated. As will be appreciated, however, mutual inductance and the resultant inductive coupling between the coils $50_1$ and $50_2$ can lead to crosstalk between the coils and reduce overall SNR.

The NMR signal received by each coil $50_1$ and $50_2$ generates a signal current in each coil. Due to the mutual inductance between the two coils, coil $50_1$ induces a current in coil $50_2$ and vice versa. The decoupling loops are designed so as to create a mutual inductance opposing the mutual inductance between coils $50_1$ and $50_2$ to reduce the overall mutual inductance between the receive coils $50_1$ and $50_2$. This opposing mutual inductance opposes the current that coil $50_1$ induces in coil $50_2$ and vice versa, thereby decoupling the coils $50_1$ and $50_2$.

The flux pipe 52 includes first $252_1$ and second $252_2$ decoupling coils which overlap the coils $50_1$, $50_2$ or are otherwise magnetically coupled thereto. The first $252_1$ and second $252_2$ decoupling coils are electrically connected by first 202 and second 204 electrical conductors, which cross at a crossover 206 located electrically between the decoupling coils $252_1$, $252_2$. In one implementation, the conductors take the form of a coaxial cable where the loops are connected so as to form the crossover. The flux pipe is preferably non-resonant at the Larmor frequency of the excited nuclei. While FIG. 2a shows the decoupling coils $252_1$, $252_2$ as partially overlapping the coils $50_1$ and $50_2$, the decoupling coils $252_1$, $252_2$ may completely overlap the coils $50_1$, $50_2$, as depicted in FIG. 2c.

FIG. 2b depicts the equivalent electrical circuit of the coil 50 depicted in FIGS. 2a and 2c. In operation of the MR system, magnetic resonance signals generated by nuclei in the object 13 induce an alternating current in the coils $50_1$, $50_2$. For the purposes of explanation, an exemplary current in coil $50_1$ is shown flowing in the direction of the arrow 260. This current induces an opposing current in coil $50_2$ as shown by the arrow 262. The magnitude of the current induced in the second coil $50_2$ is dependent on the inductive coupling coefficient K1 between the first $50_1$ and second $50_2$ coils. While not shown explicitly in FIG. 2b, those skilled in the art will recognize that, as a result of the inductive coupling between the coils, a current flowing in the second coil $50_2$ will likewise induce a current in the first coil $50_1$.

The flux pipe 52 and its first $252_1$ and second $252_2$ decoupling coils are located so that the first decoupling coil $252_1$ couples primarily with the first coil $50_1$, whereas the second decoupling coil $252_2$ couples primarily with the second coil $50_2$. Accordingly, current flowing in first coil $50_1$ induces a current in the first decoupling coil $252_1$, the magnitude of which is a function of the current in the first receive coil $50_1$ and the coupling coefficient K2 between the first coil $50_1$ and the first decoupling coil $50_2$. This current is phase shifted by one hundred and eighty degrees (180°) by the crossover 206 and flows through the second decoupling coil $252_2$. This current in turn induces a current in the second coil $50_2$ in a direction opposite to the current induced therein by the first coil $50_1$. The magnitude of the current induced by the second decoupling coil $252_2$ is a function of current in the second decoupling coils $252_2$ and the coupling coefficient K3 between the second coil $50_2$ and the second decoupling coil $252_2$. Those skilled in the art will recognize that the flux pipe 52 operates similarly for currents induced in the second decoupling coil $252_2$ by the second coil $50_2$. Where the objective is to maximally decouple the receive coils, the flux pipe 52 is preferably adjusted so that the magnitude of the current induced by the flux pipe is approximately equal to the magnitude of the current caused by the mutual inductance of the receive coils.

As will be appreciated, the optimal geometry of the coil 50 and the various coil elements $50_1$, $50_2$, and thus the coupling coefficient K1, are largely a function of the size and shape of the object 13 and the region of interest. The coupling coefficients K2 and K3 can be adjusted to reduce or otherwise provide a desired decoupling between the first $50_1$ and second $50_1$ coils, for example by adjusting the size and position of the decoupling coils $252_1$, $252_2$ relative to the corresponding coil elements $50_1$, $50_2$ and by adjusting the phase shift introduced by the flux pipe 52. In this regard, it should be noted that the flux pipe may 52 also incorporate active electronic elements such as one or more transistors and varactors to actively control the magnitude and phase of the current flowing in the flux pipe 52, and thus the decoupling between the first $50_1$ and second $50_2$ coils. Active elements can also be used to allow the flux pipe 52 to decouple dual tuned coils. The flux pipe 52 may also be used in conjunction with other coils and coil decoupling techniques.

Figure 3:
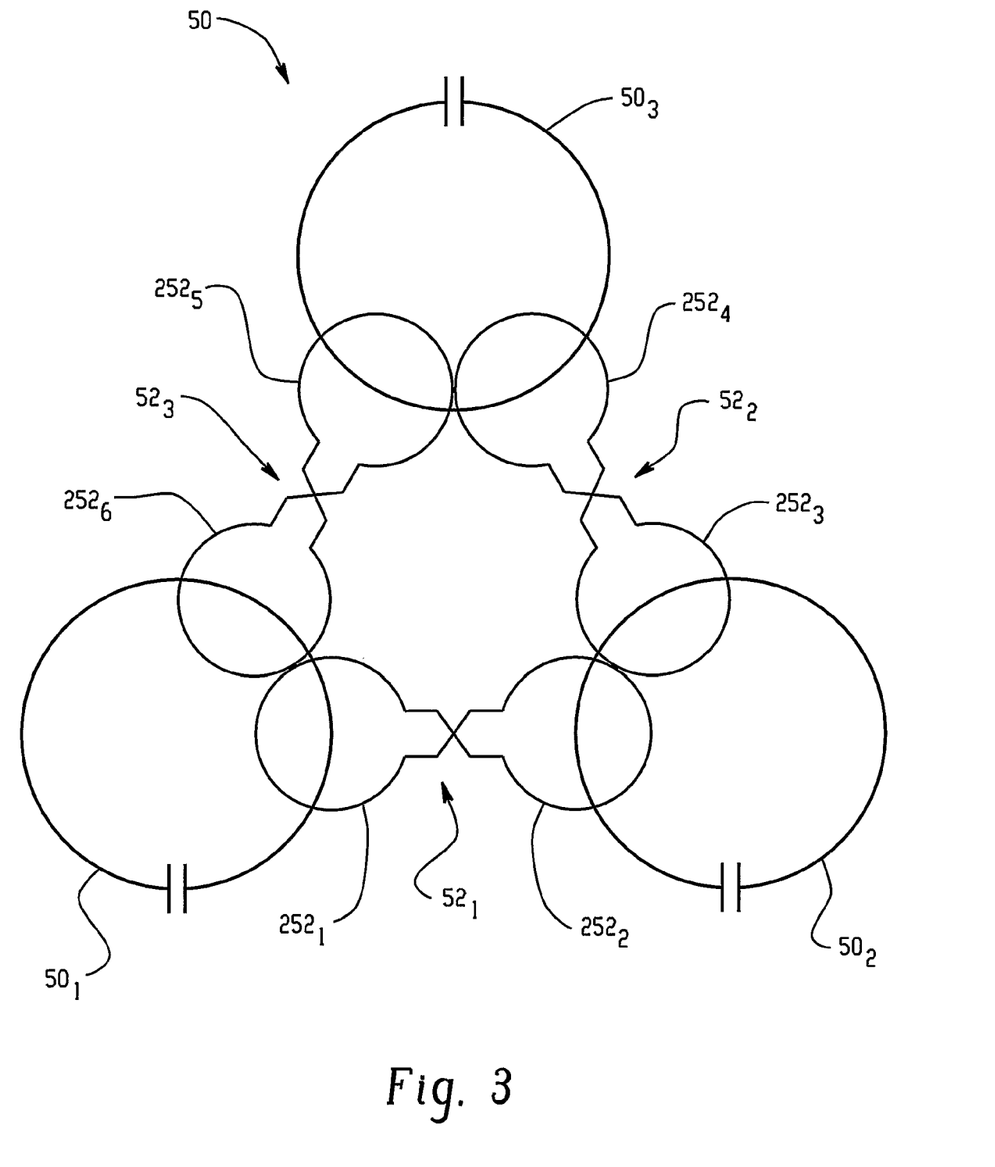
FIG. 3 depicts a three element RF coil.

The technique may be extended to decouple additional coils. FIG. 3 depicts a receive coil 50 incorporating three coils $50_1$, $50_2$, $50_3$ disposed in a generally triangular arrangement and three flux pipes $52_1$, $52_2$, $52_3$. As described above, the first flux pipe $52_1$ is used to decouple the first $50_1$ and second $50_2$ coils, the second flux pipe $52_2$ is used to decouple the second $50_2$ and third $50_3$ coils, and the third flux pipe $52_3$ is used to decouple the third $50_3$ and first $50_1$ coils in a manner analogous that described above in relation to FIG. 2.

Figure 4:
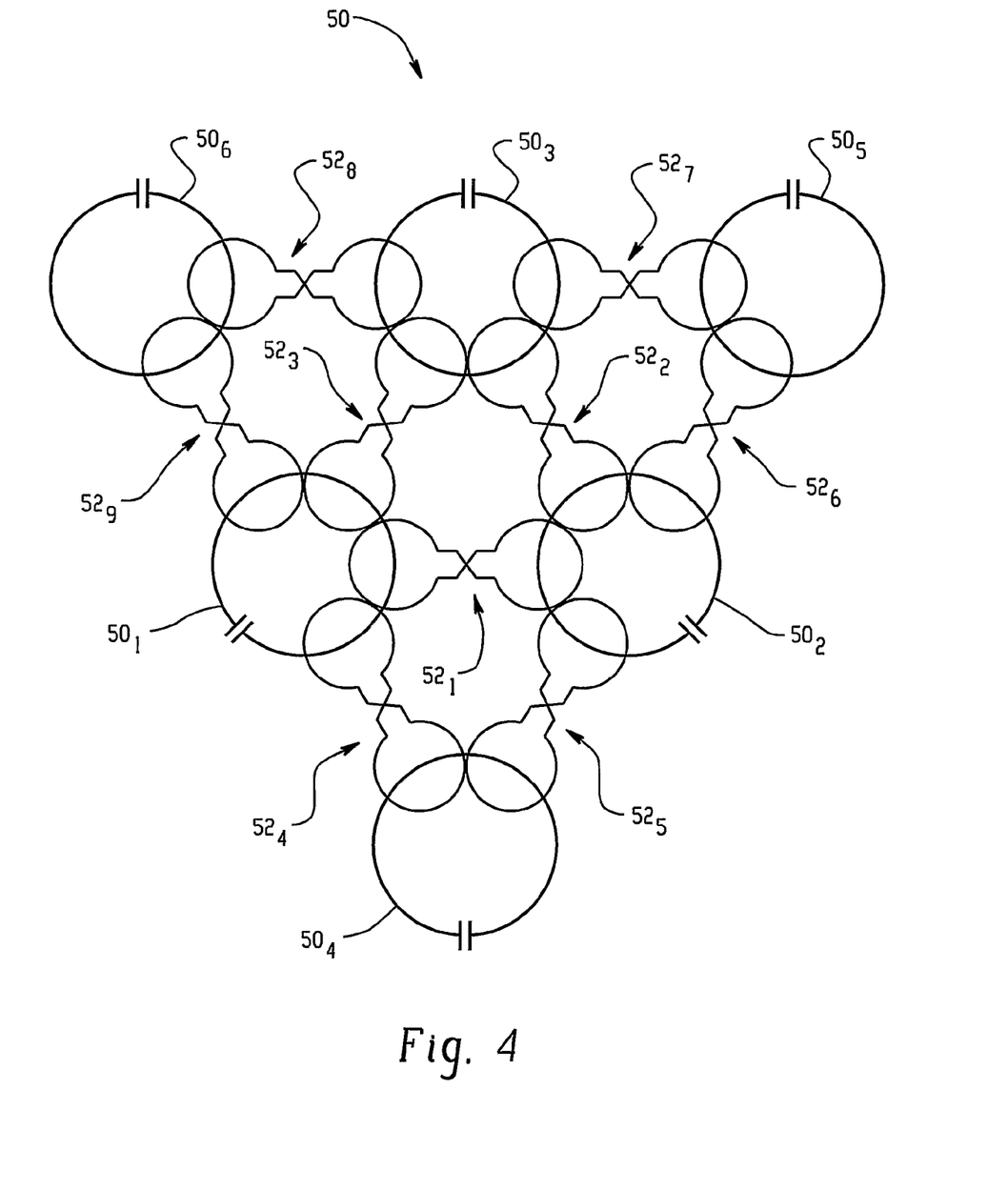
FIG. 4 depicts a six element RF coil.

FIG. 4 depicts an arrangement in which three (3) additional coils $50_4$, $50_5$, $50_6$ and six (6) additional flux pipes $52_4$, $52_5$, $52_6$, $52_7$, $52_8$, $52_9$ are added to the arrangement of FIG. 3 to produce a receive coil having six (6) coils and nine (9) flux pipes. Additional elements 50 can be added in any direction by incorporating two (2) additional flux pipes 52 to create a still larger coil 50 having a desired size and shape. In such a generally triangular coil configuration, each coil 50 can have up to six (6) nearest or first order neighbors. While each coil 50 is shown as being decoupled from its nearest neighbor, second or higher order neighbors may also be decoupled. Note that the coupling between the flux pipes 52 would be similar to the decoupling between the loops when using the overlap technique. Accordingly, it is desirable to calculate the mutual inductance across the system and then design a series of flux pipes to reduce the overall mutual inductance.

Figure 5:
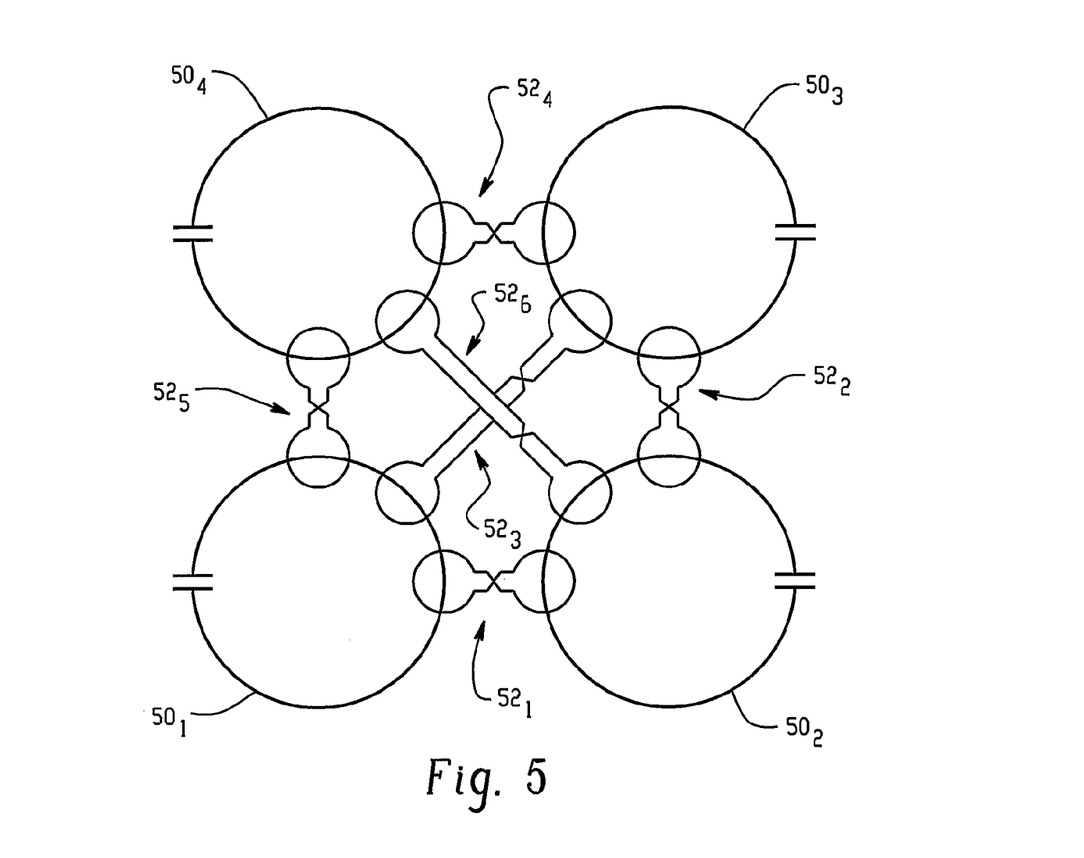
FIG. 5 depicts a four element RF coil.

FIG. 5 depicts an arrangement in which six (6) flux pipes $52_1$, $52_2$, $52_3$, $52_4$, $52_5$, $52_6$ are used to decouple four (4) coils $50_1$, $50_2$, $50_3$, $50_4$ disposed in a generally rectangular arrangement. While each coil 50 is shown as being decoupled from its nearest neighbor, one or more of the flux pipes 52 may also be omitted depending on the structure and geometry of a given coil 50, and especially where the coupling coefficient between two more of the coils is relatively low. Again, the arrangement may be extended as desired using additional coils 50 and flux pipes 52 disposed in a desired configuration.

Figure 6:
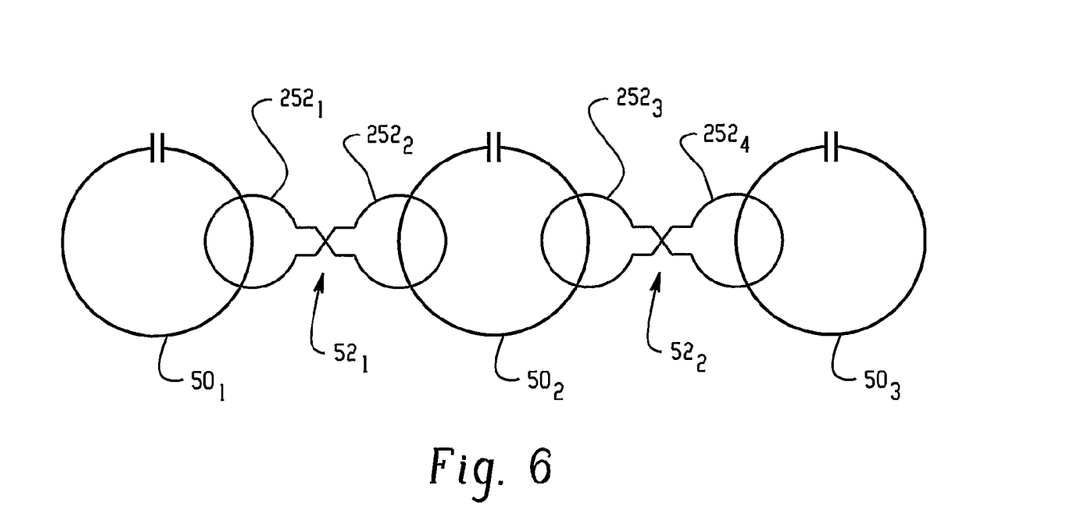
FIG. 6 depicts a three element RF coil.

FIG. 6 depicts three receive coils $50_1$, $50_2$, $50_3$ disposed in a linear one-dimensional array. As shown, the receive coils are decoupled from their first order neighbors by a flux pipe $52_1$, $52_2$. The array may be extended by the addition of additional receive coils and flux pipes. Additional flux coils may also be employed to decouple the receive coils from their higher order neighbors. In another arrangement, the receive coils may be disposed to form a loop, in which case the coils at the end of the array could advantageously be decoupled using an additional flux pipe.

It will also be appreciated that the individual coil elements 50 need not be circular, and can take a desired shape. The spacing between the coil elements 50 also need not be uniform, and various of the coils may also be of different sizes or shapes. Moreover, the structure of the coil 50 need not be planar and can be adjusted as desired, for example to generally conform a desired portion of the anatomy of a human patient. Thus, for example, the coils and their substrates may be arranged to provide coils optimized to image the head, cervical spine, spine, jaw, shoulder, heart, the arms or legs, or other desired regions of the patient's anatomy.

Similarly, the decoupling coils 252 need not be round, and can take a desired shape, for example a rectangular, polygon, or a half-moon shape. The length and curvature of the conductors connecting the various decoupling coils 252 are adjusted to conform to the configuration of the coil 50. It should also be understood that the conductors 204, 206 may cross over at more than a single cross over point 206, as an odd number of crossovers or twists will result in a 180° phase shift, while an even number will produce a 0° phase shift.

In one implementation, the coils 50 may be fabricated using conventional conductor materials such as copper or silver fabricated on a suitable substrate, or mounted directly on the coil frame without a substrate. The coils and conductors associated with the flux pipe 52 may likewise be fabricated from copper or materials which are electrically conductive at room temperature. In such an implementation, some or all of the various coils and conductors may be fabricated using curved or other shaped substrate(s) which conform to a desired region of the patient's anatomy.

Figure 7A:
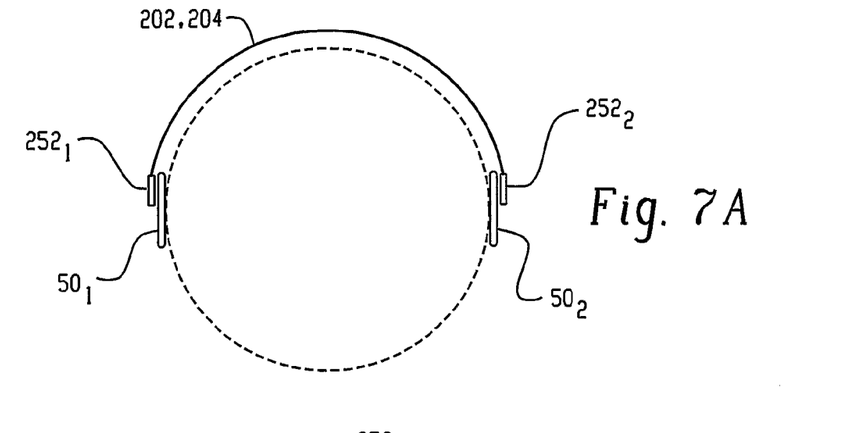
FIGS. 7a, 7b, 7c depict exemplary physical relationships between the elements of a two element RF coil.
Figure 7B:
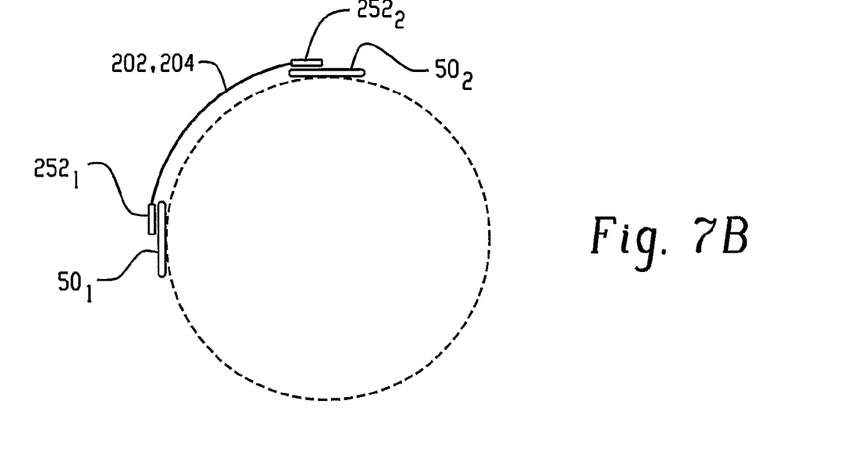
Figure 7C:
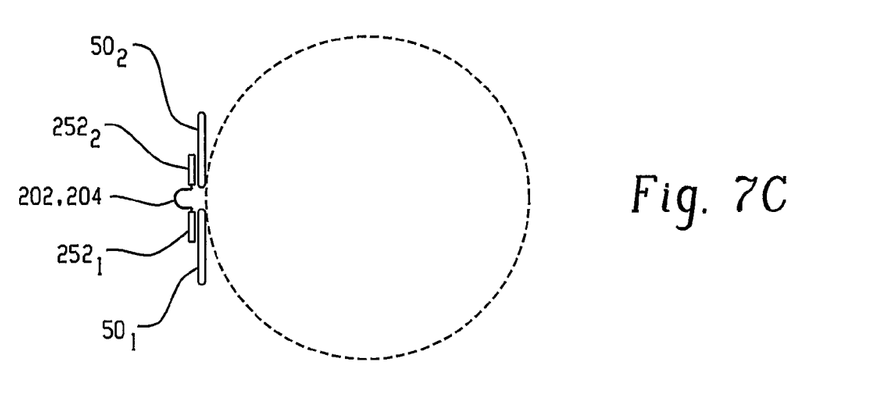

FIGS. 7a, 7b, and 7c depict exemplary coils $50_1$, $50_2$ disposed in 180° opposed, 90°, and 0° configurations about an 8 inch (20.32 cm) cylinder 602. The coils are fabricated as 2 inch (5.08 cm) diameter copper surface coils with the frequency tuned to 81.75 MHz. As shown in FIG. 7c, the coils $50_1$, $50_2$ are separated by a distance of 0.5 inch (1.27 cm). The flux pipe 52 is fabricated with two 1 inch (2.54 cm) single loop decoupling coils $252_1$, $252_2$ connected by conductors 202, 204 having a single crossover to generate a 180° phase shift. As will be appreciated, the coupling between the first $50_1$ and second $50_2$ coils due to the mutual inductance between them is a function of their relative size, orientation, and separation. The degree of decoupling provided by the flux pipe 52 is adjusted empirically by varying the relative positions of the respective receive $50_1$, $50_2$ and decoupling $252_1$, $252_2$ coils. In one example, coils as shown in FIGS. 7a, 7b, and 7c were measured as having an insertion loss, measured using an S21 technique, of −17 decibels (dB), −15 dB, and −16.7 dB, for the 180°, 90° and 0° configurations, respectively, prior to use of the flux pipes. Following the addition and adjustment of the flux pipe 52, insertion losses of −39 db, −38 dB, and 33.3 dB were measured demonstrating an increased isolation between the coils due to the flux pipe.

In another implementation, the coils may be fabricated using copper and cooled to decrease the resistivity which thereby reduces the thermal noise of the copper. One example of this is cooling the copper with liquid nitrogen, in which case the copper would be at approximately 77 Kelvin.

In another implementation, the coils 50 may be fabricated using superconductor material which includes HTS films such as $YBa_2Cu_3O_7$ (YBCO), which has a critical temperature of about 89 Kelvin, or $Tl_2Ba_2CaCu_2O_8$ (TBCCO), which has a critical temperature of about 105 Kelvin, or niobium tin or the recently developed Manganese Oxide. In an implementation using thin film HTS materials, the HTS material is typically deposited on a substrate such as sapphire ($AlO_2$) or lanthanum aluminate ($LaAlO_3$), and the HTS material is patterned and etched using a chemical etching process similar to that used in semiconductor manufacturing. In an embodiment especially well suited for use at 0.2 T, the coils 50 are configured as a single multi-turn spiral inductor with distributed and lumped capacitance, although interdigitated coils may also be implemented, particularly at higher field strengths. The flux pipes 52 are preferably implemented using a conventional conductor such as copper. Of course, other materials and construction methods may be implemented.

One limitation of current HTS fabrication techniques is that the substrates are generally rigid, planar structures. To conform to a non-planar structure such as the human body, the individual coils 50 may be fabricated on a number of separate planar substrates which are in turn mechanically coupled to provide a desired shape. As the flux pipes 52 are constructed using conventional conductor materials, they may be shaped to provide the desired decoupling between respective coils 50.

Figure 8:
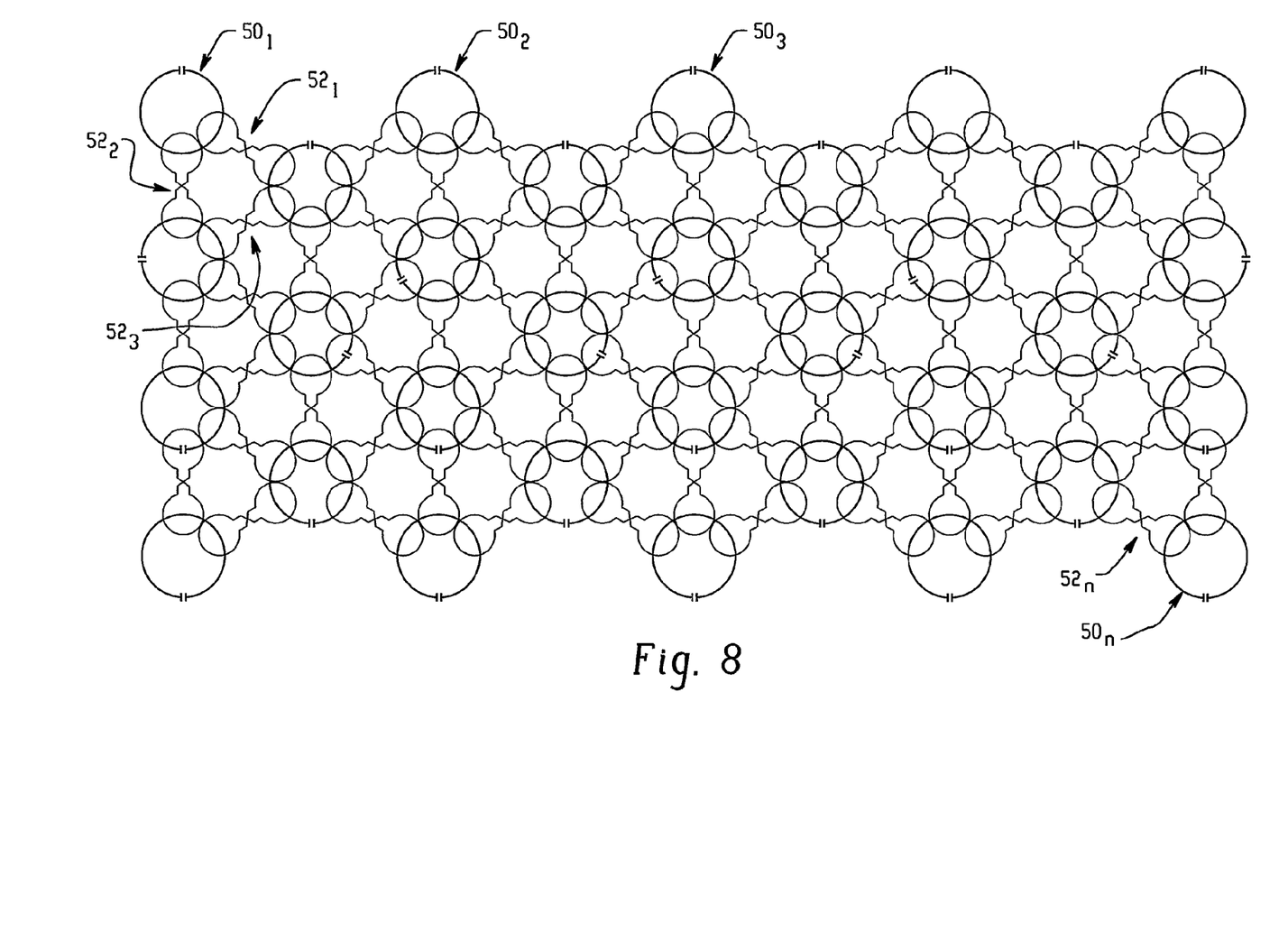
FIG. 8 depicts an exemplary spine coil.

FIG. 8 depicts the arrangement of coils 50 and flux pipes 52 in an exemplary spine coil. The coils 50 are arranged in a triangular relationship to each other. Stated another way, adjacent rows (or columns) are offset by one-half the coil 50 pitch. In such an arrangement, each coil 50 has no more than six (6) nearest neighbors. Each coil is decoupled from its nearest neighbors. The coil array is sized to provide coverage over a desired portion of the human spine. The coils 50 in FIG. 8 are shown as being relatively far apart for ease of illustration; in an actual coil array, the coils 50 would be somewhat closer together.

Of course, modifications and alterations will occur to others upon reading and understanding the preceding description. It is intended that the invention be construed as including all such modifications and alterations insofar as they come within the scope of the appended claims or the equivalents thereof.

What is claimed is:

1. A magnetic resonance coil comprising:
   a first magnetic resonance receive coil;
   a second magnetic resonance receive coil; and
   a first decoupling apparatus comprising;
      a first decoupling coil inductively coupled to the first receive coil;
      a second decoupling coil inductively coupled to the second receive coil;
      electrical conductors that connect the first and second decoupling coils so as to form an electrical circuit therebetween, wherein the electrical conductors form a crossover located electrically between the first and second decoupling coils; and
   an active electronic element that automatically varies, when imaging an object, an electrical a current in the electrical circuit in response to an electrical current induced by a mutual inductance between the first and second magnetic resonance receive coils, which varies based at least one of a shape or a size of the object, such that an electrical current induced by the first decoupling apparatus is approximately equal to the electrical current induced by a mutual inductance between the first and second magnetic resonance receive coils.

2. The magnetic resonance coil of claim 1 wherein the active electronic element comprises a varactor.

3. The magnetic resonance coil of claim 1 wherein the active electronic element comprises a transistor.

4. The magnetic resonance coil of claim 1 wherein operation of the active electronic element varies a magnitude of the current flowing in the electrical circuit.

5. The magnetic resonance coil of claim 1 wherein operation of the active electronic element varies a phase of the current flowing in the electrical circuit.

6. The magnetic resonance coil of claim 1 wherein the first receive coil comprises an HTS material.

7. The magnetic resonance coil of claim 6 wherein the electrical conductors are electrically conductive at room temperature.

8. The magnetic resonance coil of claim 1 wherein the first receive coil has a first shape and the second receive coil has a second shape, and wherein the first and second shapes are different.

9. The magnetic resonance coil of claim 1 wherein the first receive coil has a first size and the second receive coil has a second size, and wherein the first and second sizes are different.

10. The magnetic resonance coil of claim 1 comprising:
    a third magnetic resonance receive coil, wherein the first, second, and third receive coils are non-overlapping and disposed in a linear, one-dimensional array; and
    a second decoupling apparatus comprising:
       a third decoupling coil inductively coupled to the second receive coil;
       a fourth decoupling coil inductively coupled to the third receive coil; and
       electrical conductors that connect the third and fourth decoupling coils so as to form an electrical circuit therebetween, wherein the conductors form a crossover located electrically between the third and fourth decoupling coils.

11. The magnetic resonance coil of claim 1 comprising:
    third, fourth, fifth, sixth, and seventh magnetic resonance receive coils, wherein the second, third, fourth, fifth, sixth, and seventh magnetic resonance receive coils are disposed at equal angular intervals about the first receive coil; and
    second, third, fourth, fifth, and sixth decoupling apparatuses that decouple the first receive coil from respective ones of the third through seventh receive coils, each decoupling apparatus comprising:

a third decoupling coil inductively coupled to the first receive coil;

a fourth decoupling coil inductively coupled to a respective one of the third through seventh receive coils; and electrical conductors that connect the third and fourth decoupling coils so as to form an electrical circuit therebetween, wherein the conductors form a crossover located electrically between the third and fourth decoupling coils.

12. The apparatus of claim 1 wherein the first receive coil is fabricated on a first rigid substrate, the second receive coil is fabricated on a second rigid substrate, and wherein the first and second substrates are non-coplanar.

13. A method of decoupling first and second magnetic resonance receive coils, the method comprising:

varying a characteristic of a decoupling apparatus, wherein the varying is performed via an active electronic element of a decoupling apparatus that comprises a first decoupling coil inductively coupled to the first receive coil and a second decoupling coil inductively coupled to the second receive coil and connected to the first decoupling coil by electrical conductors that form a crossover wherein the varying includes automatically varying an electrical current of the decoupling apparatus during imaging to have an electrical current induced by the decupling apparatus of approximately equal to an electrical current induced by a mutual inductance between the first and second magnetic resonance receive coils.

14. The method of claim 13 wherein the active electronic element comprises one of a transistor and a varactor.

15. The method of claim 13 wherein the characteristic comprises a phase of a current flowing in the decoupling apparatus.

16. The method of claim 13 wherein the characteristic comprises an impedance.

17. The method of claim 16 wherein using an active electronic element comprises using the active electronic element to vary a resistive component of the impedance.

18. The method of claim 16 wherein using an active electronic element comprises using the active electronic element to vary a reactive component of the impedance.

19. The method of claim 13 wherein the first and second receive coils comprise dual tuned coils and using an active electronic element comprises using the active electronic element to decouple the dual tuned coils.

20. The method of claim 13 comprising:

using the first and second receive coils to receive magnetic resonance signals from an object under examination; and using the signals to generate volumetric data indicative of the object.

21. A magnetic resonance coil array comprising:

a plurality of magnetic resonance coils; and at least one flux pipe that alters a mutual inductance between first and second coils of the array, the flux pipe comprising:

a first decoupling coil inductively coupled to the first magnetic resonance coil;

a second decoupling coil electrically connected to the first decoupling coil and inductively coupled to the second magnetic resonance coil; and an active electrical component that automatically varies a characteristic of the flux pipe, wherein the characteristic is an electrical current of the flux pipe and is varied in response to an electrical current induced by a mutual inductance between the first and second coils during imaging.

22. The coil array of claim 21 wherein the flux pipe comprises first and second electrical conductors that form a crossover that provides a phase angle shift of approximately 180 degrees.

23. The coil array of claim 21 wherein the magnetic resonance coils are disposed in a two dimensional array in which adjacent columns of the array are offset by a non-zero fraction of the magnetic resonance coil pitch and comprising a plurality of flux pipes that alter a mutual inductance between nearest neighbors of the magnetic resonance coil array.

24. The coils array of claim 23 wherein adjacent columns of the array are offset by approximately one-half the pitch.

25. The coil array of claim 21 wherein the magnetic resonance coils are non-coplanar.

26. The coil array of claim 21 wherein the coil array comprises first and second planar substrates, the first coil comprises a first conductor disposed on the first substrate and the second coil comprises a second superconductor disposed on the second substrate.

27. The coil array of claim 21 wherein the coil array comprises first, second, third, and fourth non-overlapping magnetic resonance coils and first, second, third, fourth, fifth, and sixth flux pipes that alter the mutual inductance between corresponding pairs of the first, second, third, and fourth magnetic resonance coils.

28. The coil array of claim 21 wherein the coil array forms a part of a magnetic resonance imaging apparatus.

\* \* \* \* \*

US008035382C1

(12) INTER PARTES REEXAMINATION CERTIFICATE (770th)

United States Patent
DeVries et al.

(10) Number: US 8,035,382 C1
(45) Certificate Issued: Dec. 13, 2013

(54) COIL DECOUPLING IN MAGNETIC RESONANCE IMAGING

(75) Inventors: Jon T. DeVries, Jersey City, NJ (US); Erzhen Gao, Millburn, NJ (US); Ingmar Viohl, Milwaukee, WI (US); Greig Scott, Palo Alto, CA (US); Kamal Vij, Chandler, AZ (US); Joseph R. Flicek, New York, NY (US)

(73) Assignee: M2M Imaging Corp., Cleveland, OH (US)

Reexamination Request:
No. 95/001,905, Feb. 27, 2012

Reexamination Certificate for:
Patent No.: 8,035,382
Issued: Oct. 11, 2011
Appl. No.: 11/720,049
Filed: Jan. 9, 2009

(21) Appl. No.: 95/001,905

(22) PCT Filed: Nov. 22, 2005

(86) PCT No.: PCT/US2005/042464
§ 371 (c)(1),
(2), (4) Date: Jan. 9, 2009

(87) PCT Pub. No.: WO2006/137946
PCT Pub. Date: Dec. 28, 2006

Related U.S. Application Data

(60) Provisional application No. 60/630,457, filed on Nov. 23, 2004, provisional application No. 60/630,223, filed on Nov. 23, 2004, provisional application No. 60/630,220, filed on Nov. 23, 2004.

(51) Int. Cl.
*G01V 3/00* (2006.01)

(52) U.S. Cl.
USPC .......................................... 324/318; 324/322

(58) Field of Classification Search
None
See application file for complete search history.

(56) References Cited

To view the complete listing of prior art documents cited during the proceeding for Reexamination Control Number 95/001,905, please refer to the USPTO's public Patent Application Information Retrieval (PAIR) system under the Display References tab.

*Primary Examiner* — Robert Nasser (57) ABSTRACT

A radio frequency coil array (50) includes at least first ($50_1$) and second ($50_2$) receive coils. A flux pipe (52) includes electrically connected first ($252_1$) and second ($252_2$) loop coils. The first ($252_1$) and second ($252_2$) loop coils are coupled to the respective first and second receive coils. The flux pipe (52) reduces mutual inductance between the first ($50_1$) and second ($50_2$) receive coils.

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 11, 23 and 24 are cancelled.

Claims 1, 13 and 21 are determined to be patentable as amended.

Claims 2-10, 12, 14-20 and 25-28, dependent on an amended claim, are determined to be patentable.

Claim 22 was not reexamined.

1. A magnetic resonance coil comprising:
   a first magnetic resonance receive coil;
   a second magnetic resonance receive coil; and
   a first decoupling apparatus comprising;
      a first decoupling coil inductively coupled to the first receive coil;
      a second decoupling coil inductively coupled to the second receive coil; *and*
      electrical conductors that connect the first and second decoupling coils so as to form an electrical circuit therebetween, wherein the electrical conductors form a crossover located electrically between the first and second decoupling coils; [and]
   *third, fourth, fifth, sixth, and seventh magnetic resonance receive coils, wherein the second, third, fourth, fifth, sixth, and seventh magnetic resonance receive coils are disposed at equal angular intervals about the first receive coil;*
   *second, third, fourth, fifth, and sixth decoupling apparatuses that decouple the first receive coil from respective ones of the third through seventh receive coils, each decoupling apparatus comprising:*
      *a third decoupling coil inductively coupled to the first receive coil;*
      *a fourth decoupling coil inductively coupled to a respective one of the third through seventh receive coils; and*
      *electrical conductors that connect the third and fourth decoupling coils so as to form an electrical circuit therebetween, wherein the conductors form a crossover located electrically between the third and fourth decoupling coils; and*
   an active electronic element that automatically varies, when imaging an object, an electrical current in the electrical circuit in response to an electrical current induced by a mutual inductance between the first and second magnetic resonance receive coils, which varies based at least one of a shape or a size of the object, such that an electrical current induced by the first decoupling apparatus is approximately equal to the electrical current induced by a mutual inductance between the first and second magnetic resonance receive coils.

13. A method of decoupling first and second magnetic resonance receive coils, the method comprising:
    varying a characteristic of a decoupling apparatus, wherein the varying is performed via an active electronic element of a decoupling apparatus that comprises a first decoupling coil inductively coupled to the first receive coil and a second decoupling coil inductively coupled to the second receive coil and connected to the first decoupling coil by electrical conductors that form a crossover *that provides a phase angle shift of approximately 180 degrees* wherein the varying includes automatically varying an electrical current of the decoupling apparatus during imaging to have an electrical current induced by the decoupling apparatus of approximately equal to an electrical current induced by a mutual inductance between the first and second magnetic resonance receive coils.

21. A magnetic resonance coil array comprising:
    a plurality of magnetic resonance coils; and
    at least one flux pipe that alters a mutual inductance between first and second coils of the array, the flux pipe comprising:
       a first decoupling coil inductively coupled to the first magnetic resonance coil;
       a second decoupling coil electrically connected to the first decoupling coil and inductively coupled to the second magnetic resonance coil; and
       an active electrical component that automatically varies a characteristic of the flux pipe, wherein the characteristic is an electrical current of the flux pipe and is varied in response to an electrical current induced by a mutual inductance between the first and second coils during imaging,
    *wherein the magnetic resonance coils are disposed in a two dimensional array in which adjacent columns of the array are offset by a non-zero fraction of the magnetic resonance coil pitch and comprising a plurality of flux pipes that alter a mutual inductance between nearest neighbors of the magnetic resonance coil array, and wherein adjacent columns of the array are offset by approximately one-half the pitch.*

\* \* \* \* \*